US010154336B2

United States Patent
Tagami et al.

(10) Patent No.: US 10,154,336 B2
(45) Date of Patent: Dec. 11, 2018

(54) SPEAKER APPARATUS

(71) Applicant: SONY CORPORATION, Tokyo (JP)

(72) Inventors: Takahisa Tagami, Kanagawa (JP);
Nobukazu Suzuki, Kanagawa (JP);
Kaneaki Fujishita, Chiba (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/512,060

(22) PCT Filed: Oct. 19, 2015

(86) PCT No.: PCT/JP2015/079416
§ 371 (c)(1),
(2) Date: Mar. 16, 2017

(87) PCT Pub. No.: WO2016/088459
PCT Pub. Date: Jun. 9, 2016

(65) Prior Publication Data
US 2017/0295423 A1 Oct. 12, 2017

(30) Foreign Application Priority Data
Dec. 2, 2014 (JP) .................... 2014-244202

(51) Int. Cl.
H04R 1/20 (2006.01)
H04R 9/04 (2006.01)
(Continued)

(52) U.S. Cl.
CPC ............... *H04R 1/20* (2013.01); *H04R 3/02* (2013.01); *H04R 9/025* (2013.01); *H04R 9/04* (2013.01);
(Continued)

(58) Field of Classification Search
CPC . H04R 1/20; H04R 9/025; H04R 9/04; H04R 17/005; H04R 2217/00; H04R 2217/01
(Continued)

(56) References Cited

U.S. PATENT DOCUMENTS 3,588,381 A * 6/1971 Schafft et al. ......... H04R 17/00
310/332
3,941,932 A * 3/1976 D'Hoogh ............... H04R 3/002
381/96
(Continued)

FOREIGN PATENT DOCUMENTS

DE 4107158 A1 9/1991
GB 2245097 A 12/1991
(Continued)

OTHER PUBLICATIONS

Extended European Search Report of EP Patent Application No. 15864616.6, dated Feb. 9, 2018, 12 pages.

*Primary Examiner* — Oyesola C Ojo
(74) *Attorney, Agent, or Firm* — Chip Law Group

(57) ABSTRACT

To reduce the driving loss in the diaphragm, and to ensure a good sound output in the wide bandwidth. It includes a circular coil bobbin at least partly disposed between a yoke and a magnet, a coil wound around the coil bobbin, the coil being configured to be moved with the coil bobbin where a driving current is supplied to the coil, a piezoelectric element having one end coupled to one end of the coil bobbin in a movement direction, the piezoelectric element being configured to be expanded and contracted and moved in a direction same as the movement direction where an electric current is supplied to the piezoelectric element, and a diaphragm having an inner circumference part coupled to another end of the piezoelectric element, and a coupled part of the diaphragm to the piezoelectric element and a coupled
(Continued)

part of the piezoelectric element to the coil bobbin are positioned on a straight line in the movement direction.

5 Claims, 8 Drawing Sheets

(51) Int. Cl.
H04R 17/00 (2006.01)
H04R 23/02 (2006.01)
H04R 9/02 (2006.01)
H04R 3/02 (2006.01)
H01L 41/083 (2006.01)
H01L 41/09 (2006.01)

(52) U.S. Cl.
CPC .......... H04R 17/00 (2013.01); H04R 17/005 (2013.01); H04R 23/02 (2013.01); H01L 41/083 (2013.01); H01L 41/0835 (2013.01); H01L 41/0836 (2013.01); H01L 41/09 (2013.01)

(58) Field of Classification Search
USPC ........................................ 381/150
See application file for complete search history.

(56) References Cited

U.S. PATENT DOCUMENTS

| 4,727,586 | A | * | 2/1988 | Johnson | H04R 1/26 381/182 |
| 5,062,139 | A | * | 10/1991 | Christensen | H04R 1/24 381/173 |
| 5,126,618 | A | | 6/1992 | Takahashi et al. | |
| 5,533,134 | A | * | 7/1996 | Tokura | H04R 3/002 381/401 |
| 9,084,051 | B2 | * | 7/2015 | Hudspeth | H04R 9/045 |
| 2005/0185809 | A1 | * | 8/2005 | Bianchini | H04R 1/24 381/190 |
| 2012/0213388 | A1 | * | 8/2012 | Hudspeth | H04R 9/08 381/114 |

FOREIGN PATENT DOCUMENTS

| JP | 55-091299 A | | 7/1980 | |
| JP | 58-176500 U | | 11/1983 | |
| JP | 59-112799 A | | 6/1984 | |
| JP | 59112799 A | * | 6/1984 | H04R 3/002 |
| JP | 64-017917 U | | 1/1989 | |
| JP | D1-17917 Y2 | | 5/1989 | |
| JP | 09-322286 A | | 12/1997 | |
| JP | 2000078691 A | * | 3/2000 | H04R 9/06 |
| JP | 2014-068342 A | | 4/2014 | |
| JP | 2015091069 A | * | 5/2015 | H04R 17/00 |
| WO | 2005/067346 A1 | | 7/2005 | |

* cited by examiner

Impulse response characteristics before correction and after correction

Frequency response characteristics before correction and after correction

Frequency response characteristics at high bandwidth of speaker apparatus in related art and speaker apparatus according to present technology

SPEAKER APPARATUS

CROSS REFERENCE TO RELATED APPLICATIONS

This application is a U.S. National Phase of International Patent Application No. PCT/JP2015/079416 filed on Oct. 19, 2015, which claims priority benefit of Japanese Patent Application No. JP 2014-244202 filed in the Japan Patent Office on Dec. 2, 2014. Each of the above-referenced applications is hereby incorporated herein by reference in its entirety.

TECHNICAL FIELD

The present technology relates to a technical field of a speaker apparatus having a driving part for vibrating a diaphragm, the driving part including a magnetic circuit and a piezoelectric element.

BACKGROUND ART

Citation List

Patent Literature

Patent Literature 1: Japanese Utility Model Application Publication No. H1-17917

DISCLOSURE OF INVENTION

There is a speaker apparatus that outputs a sound amplified by an amplifier. For example, the speaker apparatus is configured such that a diaphragm is vibrated by driving a magnetic circuit including a magnet, a yoke, and a coil, and the diaphragm is also vibrated by expanding and contracting an piezoelectric element (for example, see Patent Literature 1).

In the speaker apparatus described in Patent Literature 1, a yoke is disposed penetrating through a center of a circular magnet, and a tube-like coil bobbin is disposed between the magnet and the yoke. A coil is wound around an outer circumference face of the coil bobbin, and the coil is disposed in a magnetic gap formed between the yoke and the magnet. A piezoelectric element is formed in a disk shape, and is coupled to one end portion of the coil bobbin in an axial direction, i.e., a movement direction. The diaphragm is coupled to a center portion of the piezoelectric element.

In the speaker apparatus described in Patent Literature 1, a driving current is supplied to the coil on the basis of a sound signal output from the amplifier, the coil is moved integrally with the coil bobbin, and the diaphragm is vibrated corresponding to the movement of the coil bobbin. At the same time, the electric current is also supplied to the piezoelectric element on the basis of the sound signal output from the amplifier, the piezoelectric element is expanded and contracted to be moved, and the diaphragm is vibrated also corresponding to the movement of the piezoelectric element. Thus, the diaphragm is vibrated corresponding to the both movements of the coil bobbin and the piezoelectric element, and the sound is output in accordance with the vibration of the diaphragm.

In the speaker apparatus where the magnetic circuit and the piezoelectric element are used as a driving part that vibrates the diaphragm, it is possible to obtain a great vibration amplitude obtained by dynamic driving using the magnetic circuit and a great driving force using the piezoelectric element. As a result, a good sound output can be ensured.

Technical Problem

In the above-described speaker apparatus including the two types of the driving part, i.e., the magnetic circuit and the piezoelectric element, the diaphragm is coupled to the coil bobbin via the piezoelectric element, and the driving force generated by the magnetic circuit is transmitted from the coil bobbin to the diaphragm via the piezoelectric element.

Accordingly, if the piezoelectric element inhibits the driving force generated by the magnetic circuit from being transmitted to the diaphragm, a great vibration amplitude is not obtained, and a good sound may not be output in the speaker apparatus. It is desirable that the driving force generated by the magnetic circuit be transmitted to the diaphragm via the piezoelectric element without loss.

Also, it is desirable that a good sound be output in a wide bandwidth without having single-peaked characteristics.

It is an object of a speaker apparatus according to the present technology to overcome the above-described problems, to reduce the driving loss in the diaphragm, and to ensure a good sound output in the wide bandwidth.

Solution to Problem

First, a speaker apparatus according to the present technology includes a circular coil bobbin at least partly disposed between a yoke and a magnet, a coil wound around the coil bobbin, the coil being configured to be moved with the coil bobbin where a driving current is supplied to the coil, a piezoelectric element having one end coupled to one end of the coil bobbin in a movement direction, the piezoelectric element being configured to be expanded and contracted and moved in a direction same as the movement direction where an electric current is supplied to the piezoelectric element, and a diaphragm having an inner circumference part coupled to another end of the piezoelectric element, a coupled part of the diaphragm to the piezoelectric element and a coupled part of the piezoelectric element to the coil bobbin being positioned on a straight line in the movement direction.

Thus, the driving force generated by the magnetic circuit is transmitted to the diaphragm via the two coupled parts positioned on the straight line.

Second, in the above-described speaker apparatus, it is desirable that the piezoelectric element is coupled to a part of the coil bobbin in a circumferential direction.

Thus, the driving part of the speaker apparatus is not too heavy.

Third, in the above-described speaker apparatus, it is desirable that a plurality of the piezoelectric elements is disposed, and the plurality of the piezoelectric elements is disposed separately at equal intervals in the circumferential direction of the coil bobbin.

Thus, a good positional balance of the piezoelectric elements with respect to the coil bobbin is ensured.

Fourth, in the above-described speaker apparatus, it is desirable that the piezoelectric element is formed circular, and the piezoelectric element is coupled to the coil bobbin in a whole circumferential direction and to the diaphragm in a whole circumferential direction.

Thus, a good positional balance of the piezoelectric element with respect to the coil bobbin and the diaphragm is ensured.

Fifth, in the above-described speaker apparatus, it is desirable that the piezoelectric element is a laminated type piezoelectric element where layers are laminated in the movement direction.

Thus, the movement amount of the piezoelectric element is increased even at a low voltage.

Sixth, in the above-described speaker apparatus, it is desirable that a time correction is performed so as to roughly match an initial driving time of the diaphragm when the driving current is supplied to the coil and an initial driving time of the diaphragm when the electric current is supplied to the piezoelectric element.

Thus, mismatch between the phase of the diaphragm when the driving current is supplied to the coil driving part and the phase of the diaphragm when the driving current is supplied to the piezoelectric driving part is corrected.

Seventh, in the above-described speaker apparatus, it is desirable that a phase correction is performed so as to match a phase of the diaphragm when the driving current is supplied to the coil and a phase of the diaphragm when the electric current is supplied to the piezoelectric element.

Thus, mismatch between the phase of the diaphragm when the driving current is supplied to the coil driving part and the phase of the diaphragm when the driving current is supplied to the piezoelectric driving part is corrected.

Eighth, in the above-described speaker apparatus, it is desirable that the piezoelectric element of a d33 mode is used.

Thus, a great driving force of the piezoelectric element is obtained in the movement direction.

Advantageous Effects of Invention

According to the present technology, since the driving force generated by the magnetic circuit is transmitted to the diaphragm via the two coupled parts positioned on the straight line, the driving loss in the diaphragm is reduced and a good sound output is ensured in the wide bandwidth.

It should be noted that the effects described in the present specification are merely illustrative and are not limitative, and may have other effects.

MODE(S) FOR CARRYING OUT THE INVENTION

Hereinafter, an embodiment of a speaker apparatus according to the present technology will be described with reference to the attached drawings.

In the following description, and up-and-down, front-and-back, and left-and-right directions are shown, where the direction in which the speaker apparatus directs is defined as the front direction.

It should be noted that the up-and-down, front-and-back, and left-and-right directions described below are for convenience of the description, and the present technology is applied without being limited to these directions.

<Configuration of Speaker Apparatus>

Figure 1:
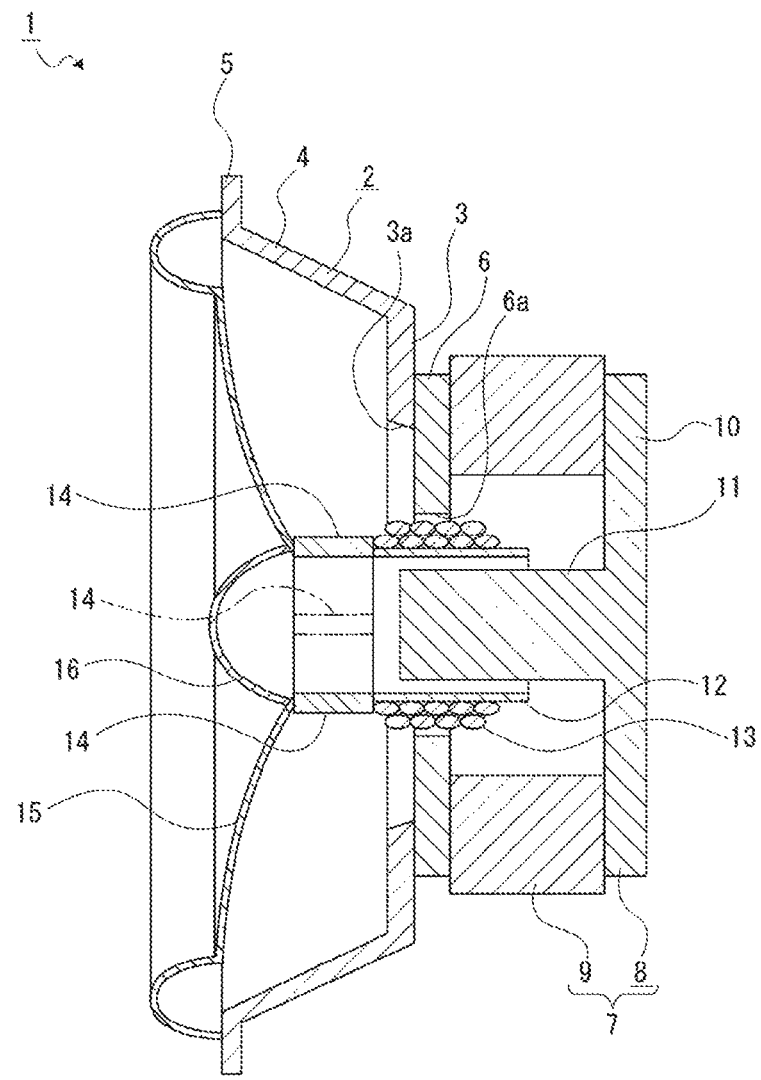
FIG. 1 shows an embodiment of a speaker apparatus according to the present technology in conjunction with FIG. 2 to FIG. 9, and is an enlarged cross-sectional view of the speaker apparatus.

A speaker apparatus 1 has a frame 2, and respective parts attached to the frame 2 (see FIG. 1).

The frame 2 has a bottom face part 3 formed in a ring shape, the bottom face part 3 facing in the front-and-back direction, a circumferential face part 4 continuous with an outer circumference part of the bottom face part 3, and a flange-like attachment part 5 extending outwardly from a front end of the circumferential face part 4. A center hole of the bottom face part 3 is formed as an insertion through hole 3a. The circumferential face part 4 is tilted so as to be displaced outwardly as going to front.

A terminal (not shown) is attached to an outer surface of the circumferential face part 4 or the attachment part 5. The terminal is disposed as a terminal part for connecting to an amplifier (not shown).

A ring-shaped magnet 6 is attached to a back face of the bottom face part 3. The magnet 6 has a center hole 6a smaller than the insertion through hole 3a of the bottom face part 3. The center axes of the center hole 6a and the insertion through hole 3a are common.

A yoke 7 is attached to a back face of the magnet 6. The yoke 7 includes a base yoke 8 and a connection yoke 9.

The base yoke 8 includes a disk-shaped base face part 10 facing in the front-and-back direction, and a rod-shaped insertion projecting part 11 projected from a center part of the base face part 10 toward front, and the base face part 10 and the insertion projecting part 11 are integrally formed. A front end of the insertion projecting part 11 of the base yoke 8 is inserted into the center hole 6a of the magnet 6. Thus, a space is formed between an inner circumference face of the magnet 6 and an outer circumference face of the insertion projecting part 11, which is formed as a magnetic gap.

The connection yoke 9 is formed in a ring shape, and has a thickness slightly smaller than a length of the insertion projecting part 11 in the axial direction. A back face of the connection yoke 9 is attached to an outer circumference side part at a front face of the base face part 10, and a front face of the connection yoke 9 is attached to an outer circumference side part at a back face of the magnet 6.

A cylindrical-shaped coil bobbin 12 is partly disposed in the magnetic gap. The coil bobbin 12 is capable of moving (reciprocating) relative to the insertion projecting part 11 in the axial direction (front and back direction).

The coil 13 is wound around an outer circumference face of the coil bobbin 12. Both ends of the coil 13 are drawn from the wound part, and are connected to the terminal. The coil 13 is partly disposed in the magnetic gap.

Since the coil 13 is disposed in the magnetic gap, the coil 13, the magnet 6, and the yoke 7 configure a magnetic circuit.

It should be noted that the speaker apparatus 1 may have a damper that suppresses an excessive movement of the coil bobbin 12 in the axial direction.

Back ends of, for example, three piezoelectric elements 14, 14, and 14 are coupled to a front end of the coil bobbin 12. For example, the piezoelectric elements 14, 14, and 14 are disposed separately at equal intervals in the circumferential direction of the coil bobbin 12 (for ease of understanding, FIG. 1 shows the piezoelectric elements 14, 14, and 14 in the positional relationship different from the actual). It should be noted that the number of the piezoelectric elements 14 is arbitrary, and at least one piezoelectric element 14 may be disposed. However, in the case where a plurality of the piezoelectric elements 14, 14, . . . are disposed, the piezoelectric elements 14, 14, . . . are desirably disposed separately at equal intervals in the circumferential direction.

For example, the piezoelectric element 14 is a laminated type piezoelectric element, which is formed extending in front and back and in which layers are laminated in the front-and-back direction. A single-layer type piezoelectric element 14 may be used. However, the laminated type piezoelectric element is desirably used in terms of increasing a displacement amount (driving force).

Where a laminated type piezoelectric element, in which layers are laminated in a movement direction (front-and-back direction), is used as the piezoelectric element 14, the movement amount of the piezoelectric element 14 is increased even at a low voltage, and high frequency characteristics may be obviously improved.

The piezoelectric element 14 of a d33 mode is used. With the use of the d33 mode piezoelectric element 14, a great driving force may be obtained in the movement direction (front-and-back direction), and a sound quality may be improved.

In addition, the d33 mode piezoelectric element 14 is characterized in that the displacement amount of each layer is the same irrespective of the thickness. Therefore, where thin layers are laminated to form the piezoelectric element 14, a great driving force may be ensured while the piezoelectric element 14 is downsized. However, where the thickness is decreased, a withstand voltage is lowered. The thickness of the piezoelectric element 14 is desirably determined by taking the driving force and the withstand voltage into consideration.

Furthermore, the d33 mode has a greater initiation stress, and is less likely to have single-peaked characteristics as compared to a d31 mode. As a result, the d33 mode piezoelectric element 14 may ensure a necessary sound pressure, and improve wide-area characteristics.

Still further, the single layer of the piezoelectric element 14 may have a simple shape such as a rectangle and a circle, which leads to easy manufacturing and reduced manufacturing costs.

Electric wires (not shown) are connected to the piezoelectric elements 14, 14, and 14, and are connected to the terminal. The electric current is supplied to the piezoelectric elements 14, 14, and 14 via the electric wires.

The outer circumference part of the diaphragm 15 is attached to the attachment part 5 of the frame 2. The front ends of the piezoelectric elements 14, 14, and 14 disposed at equal intervals in the circumferential direction are coupled to the inner circumference part of the diaphragm 15. Thus, each coupled part of the diaphragm 15 to each of the piezoelectric elements 14, 14, and 14, and each coupled part of the piezoelectric elements 14, 14, and 14 to the coil bobbin 12 are positioned respectively on a straight line in the movement direction.

The diaphragm 15 is vibrated using its front end as the fulcrum corresponding to the movement of the coil bobbin 12 in the front-and-back direction and the movement of the piezoelectric elements 14, 14, and 14 in the front-and-back direction.

The diaphragm 15 is vibrated corresponding to the movement of the coil bobbin 12 caused by the driving of the magnetic circuit, and is also vibrated corresponding to the movement caused by expansion and contraction of the piezoelectric elements 14, 14, and 14. Thus, the piezoelectric elements 14, 14, and 14 function as a part of the magnetic circuit, and also function as the driving part for vibrating the diaphragm 15.

A dome-shaped cap 16 is attached to the inner circumference part of the diaphragm 15.

<Operation of Speaker Apparatus>

In the speaker apparatus 1 configured as described above, in a case where the driving current is supplied to the coil 13, a thrust is generated in the magnetic circuit, the coil bobbin 12 is moved in the front-and-back direction (axial direction), the driving force (driving energy) of the coil bobbin 12 is transmitted to the diaphragm 15 via the piezoelectric elements 14, 14, and 14, and the diaphragm 15 is vibrated corresponding to the movement of the coil bobbin 12. At the same time, the electric current is supplied to the piezoelectric elements 14, 14, and 14, the respective piezoelectric elements 14, 14, and 14 are expanded and contracted, and are moved in the front-and-back direction, and the diaphragm 15 is vibrated also corresponding to the movement of the piezoelectric elements 14, 14, and 14. With the vibration of the diaphragm 15, sound amplified by the amplifier is output.

As described above, in the speaker apparatus 1, the piezoelectric elements 14, 14, and 14 are coupled to the respective parts of the coil bobbin 12 in the circumferential direction. Thus, the driving part of the speaker apparatus 1 is not too heavy, transient characteristics are improved, and broadband reproduction is ensured. As a result, a good sound quality and a good sound pressure are ensured.

Furthermore, the piezoelectric elements 14, 14, and 14 are disposed at equal intervals in the circumferential direction of the coil bobbin 12. Accordingly, a good positional balance of the piezoelectric elements 14, 14, and 14 with respect to the coil bobbin 12 is ensured. The driving force (driving energy) is stably transmitted from the coil bobbin 12 to the diaphragm 15 via the piezoelectric elements 14, 14, and 14, and the driving force (driving energy) is stably transmitted from the piezoelectric elements 14, 14, and 14 to the diaphragm 15, thereby reducing the driving loss.

<Control of Speaker Apparatus During Operation>

Hereinafter, the control of the speaker apparatus 1 during the operation will be described (see FIG. 2 to FIG. 7).

First, a measurement result of the control performed in the speaker apparatus 1 will be described.

Figure 2:
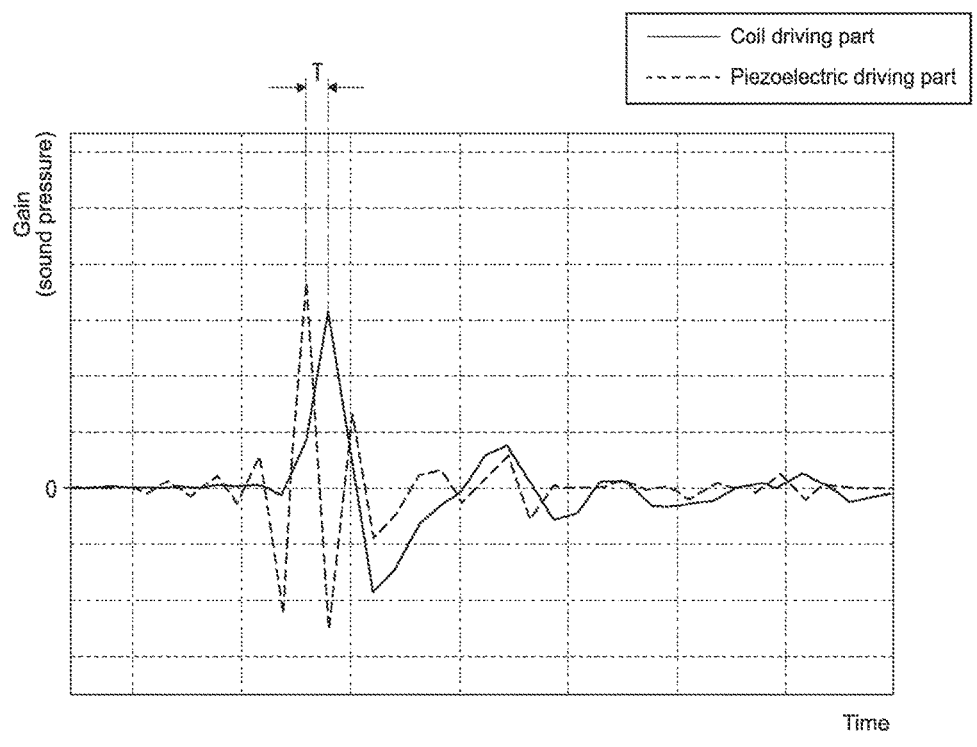
FIG. 2 is a graph showing impulse response characteristics when driving is performed in each of a coil driving part and a piezoelectric driving part.

FIG. 2 shows the result of impulse response characteristics obtained when each driving part of the speaker apparatus 1 is driven. Specifically, the state that the driving current is supplied to the coil 13 to operate the driving part (coil driving part) is compared to the state that the electric current is supplied to the piezoelectric elements 14, 14, and 14 to operate the driving part (piezoelectric driving part), and the comparison result is shown. The driving current supplied to the coil 13 and the electric current supplied to the piezoelectric elements 14, 14, and 14 are based on the same input signal.

In FIG. 2, the horizontal axis represents the time, and the vertical axis represents the gain (sound pressure). The solid line represents the state that the coil driving part is driven, and the dotted line represents the state that the piezoelectric driving part is driven.

As shown in FIG. 2, there is a difference between the initial driving time of the diaphragm 15 operated by driving the coil driving part and the initial driving time of the diaphragm 15 operated by driving the piezoelectric driving part. The operation of driving the coil driving part is delayed from the operation of driving the piezoelectric driving part by time T.

Figure 3:
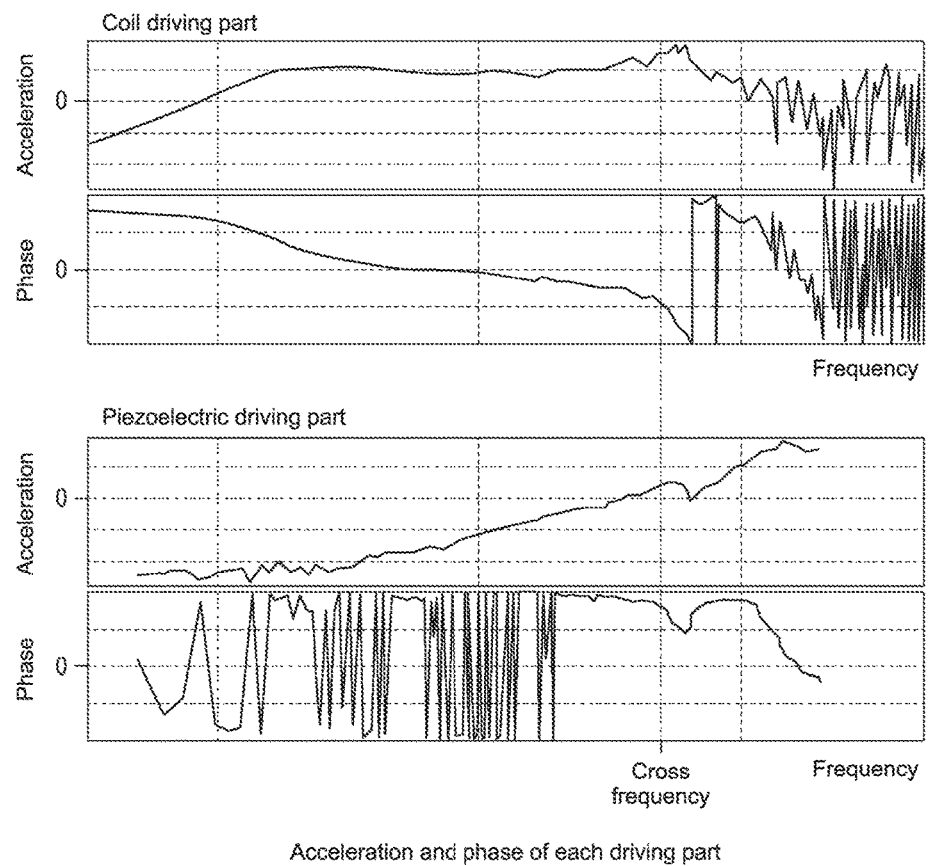
FIG. 3 is a graph showing phase characteristics of each of the coil driving part and the piezoelectric driving part.

FIG. 3 shows phase characteristics of the diaphragm 15 operated by each driving part of the speaker apparatus 1. Specifically, the acceleration and the phase are measured for each of the coil driving part and the piezoelectric driving part, where a cross frequency is defined as 7 KHz.

In FIG. 3, the horizontal axis represents the frequency, and the vertical axis represents the acceleration or the phase. The two graphs in the upper part show the acceleration and the phase of the coil driving part, and the two graphs in the lower part show the acceleration and the phase of the piezoelectric driving part.

As shown in FIG. 3, the phase of the diaphragm 15 driven by the coil driving part is inverted from the phase of the diaphragm 15 driven by the piezoelectric driving part.

On the basis of the results of the time delay T and the phase inversion as described above, a time correction and a phase inversion control are performed in the speaker apparatus 1 as described below.

Figure 4:
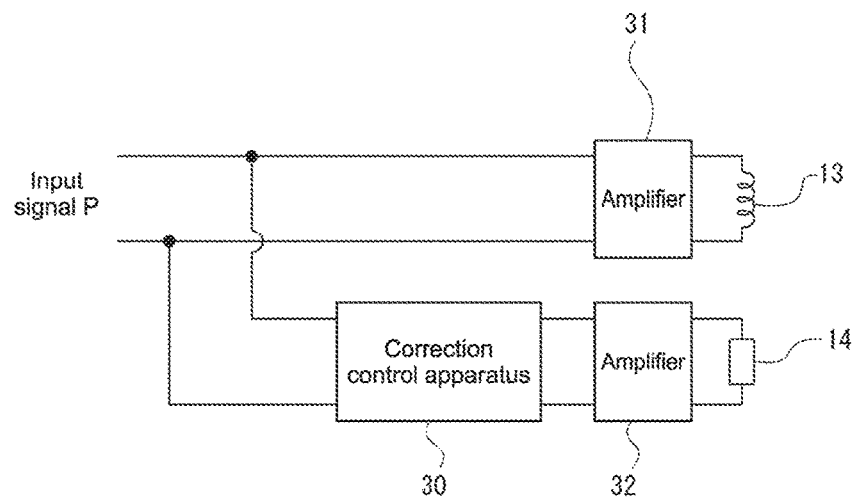
FIG. 4 is a block diagram showing an example of a circuit including a correction control apparatus.

They are controlled by a correction control apparatus 30, for example (see FIG. 4). The correction control apparatus 30 is an arithmetic processing apparatus such as a DSP (Digital Signal Processor), which delays the operation time of the coil driving part in response to the input signal for the time T, and inverts the phase of the piezoelectric driving part by 180 degrees.

An input signal P is input to an amplifier 31 that transmits a signal to the coil 13, and to an amplifier 32 that transmits a signal to the piezoelectric elements 14, 14, and 14. The signal, where the operation time and the phase are corrected by the correction control apparatus 30, is input to the amplifier 32. Therefore, the signal corrected by the correction control apparatus 30 is input to the piezoelectric elements 14, 14, and 14 from the amplifier 32.

Figure 5:
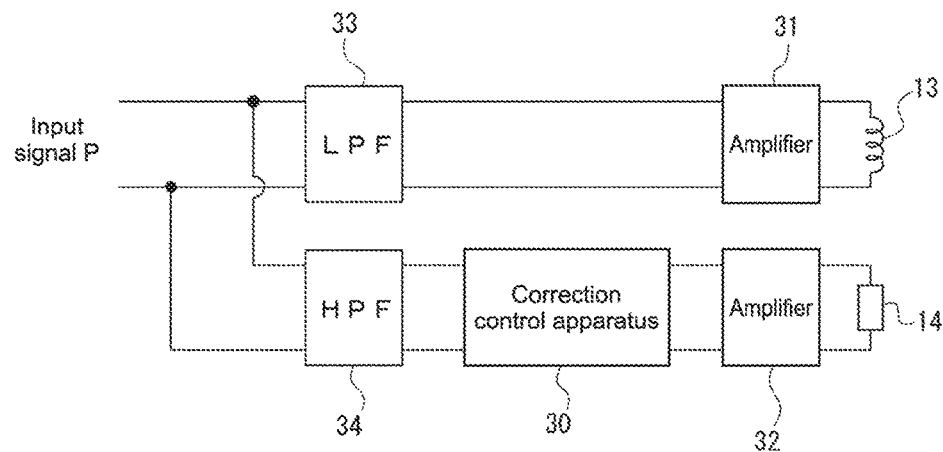
FIG. 5 is a block diagram showing another example of a circuit including a correction control apparatus.

It should be noted that, as shown in FIG. 5, the speaker apparatus 1 may be configured such that an LPF (low-pass filer) circuit 33 is inserted into an input circuit for the amplifier 31 to take out a low frequency component and to suppress a high frequency component, and an HPF (high-pass filer) circuit 34 is inserted into an input circuit for the amplifier 32 to take out the high frequency component and suppress the low frequency component.

Figure 6:
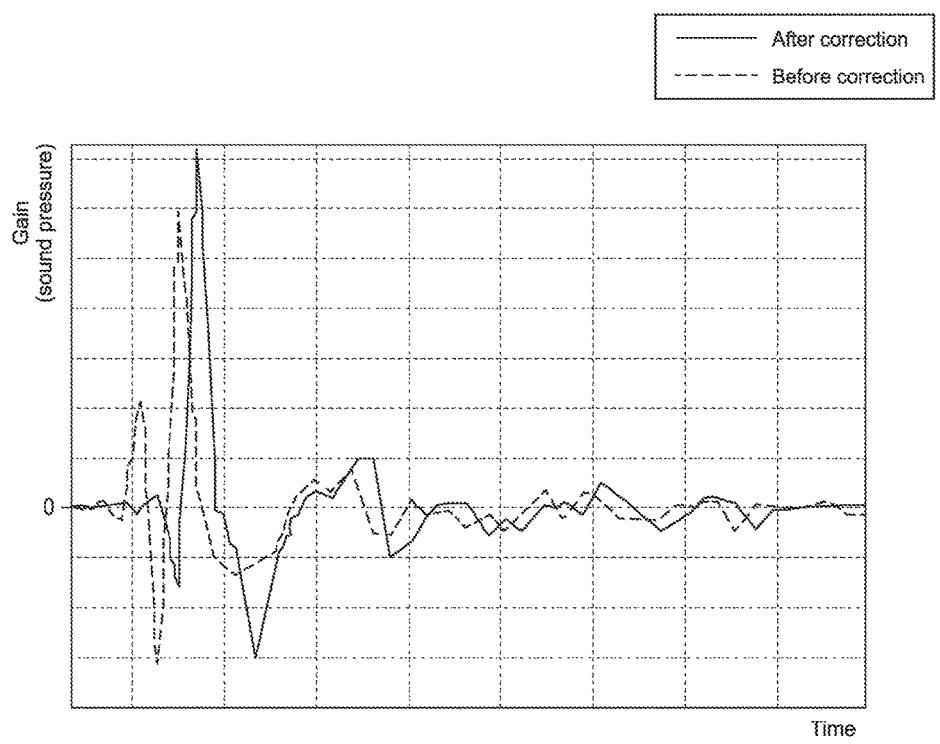
FIG. 6 shows characteristics before and after a time correction and a phase correction are performed, and is a graph showing impulse response characteristics.
Figure 7:
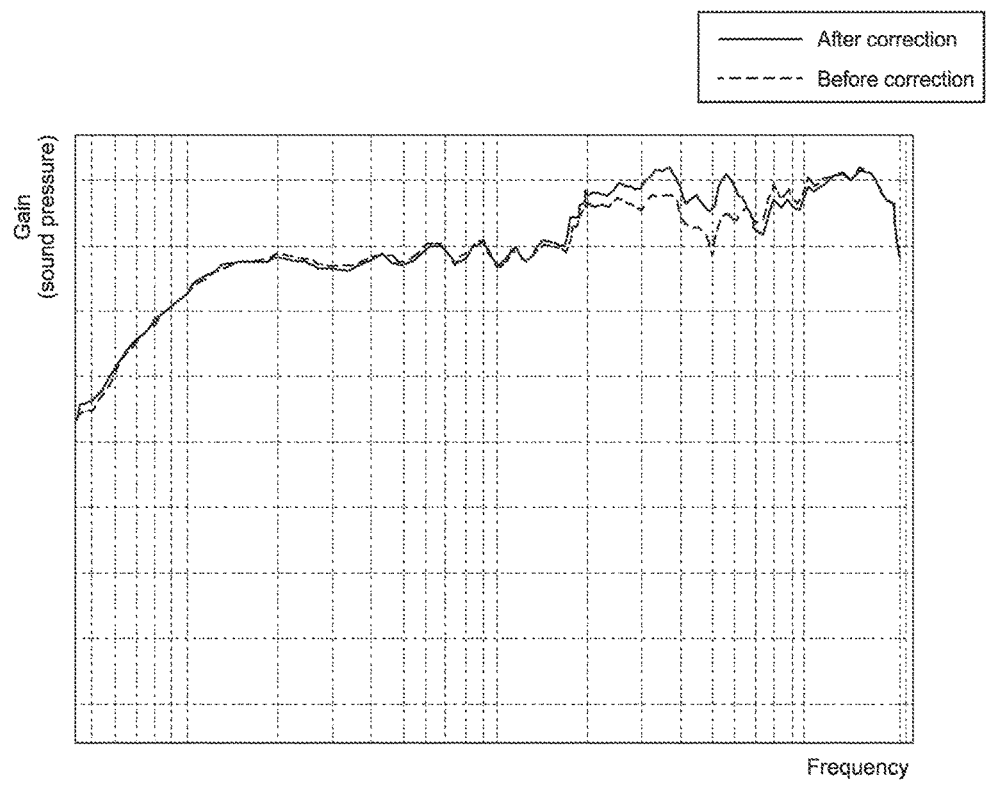
FIG. 7 shows characteristics before and after a time correction and a phase correction are performed, and is a graph showing frequency response characteristics.

FIG. 6 and FIG. 7 show the results of the characteristics before and after the time correction and the phase correction are performed. FIG. 6 shows impulse response characteristics, and FIG. 7 shows frequency response characteristics.

In FIG. 6, the horizontal axis represents the time, and the vertical axis represents the gain (sound pressure). In FIG. 7, the horizontal axis represents the frequency, and the vertical axis represents the gain (sound pressure). In FIG. 6 and FIG. 7, the solid line represents the state of after the correction, the dotted line represents the state of before the correction.

As shown in FIG. 6, after the time correction and the phase correction are performed, the gain is high especially at the peak, and good sound pressure is obtained. Also, as shown in FIG. 7, after the time correction and the phase correction are performed, the gain is high especially at the high frequency region, and good sound pressure is obtained.

As described above, the time correction is performed in the speaker apparatus 1 so as to roughly match the initial driving time of the diaphragm 15 when the driving current is supplied to the coil 13 and the initial driving time of the diaphragm when the electric current is supplied to the piezoelectric elements 14, 14, and 14.

Thus, a time lag in the response characteristics upon the operations of the coil driving part and the piezoelectric driving part is canceled, and a good sound quality is ensured.

In addition, since the time correction is performed for the coil driving part and the piezoelectric driving part, the coil driving part and the piezoelectric driving part are operated as if one driving part. As a result, a sound quality may be improved.

Furthermore, the phase correction is performed so as to match the phase of the diaphragm 15 when the driving current is supplied to the coil 13 and the phase of the diaphragm 15 when electric current is supplied to the piezoelectric elements 14, 14, and 14.

As a result, mismatch between the phase of the diaphragm 15 when the driving current is supplied to the coil driving part and the phase of the diaphragm 15 when the driving current is supplied to the piezoelectric driving part is corrected, and a better sound quality is ensured.

CONCLUSION

Figure 8:
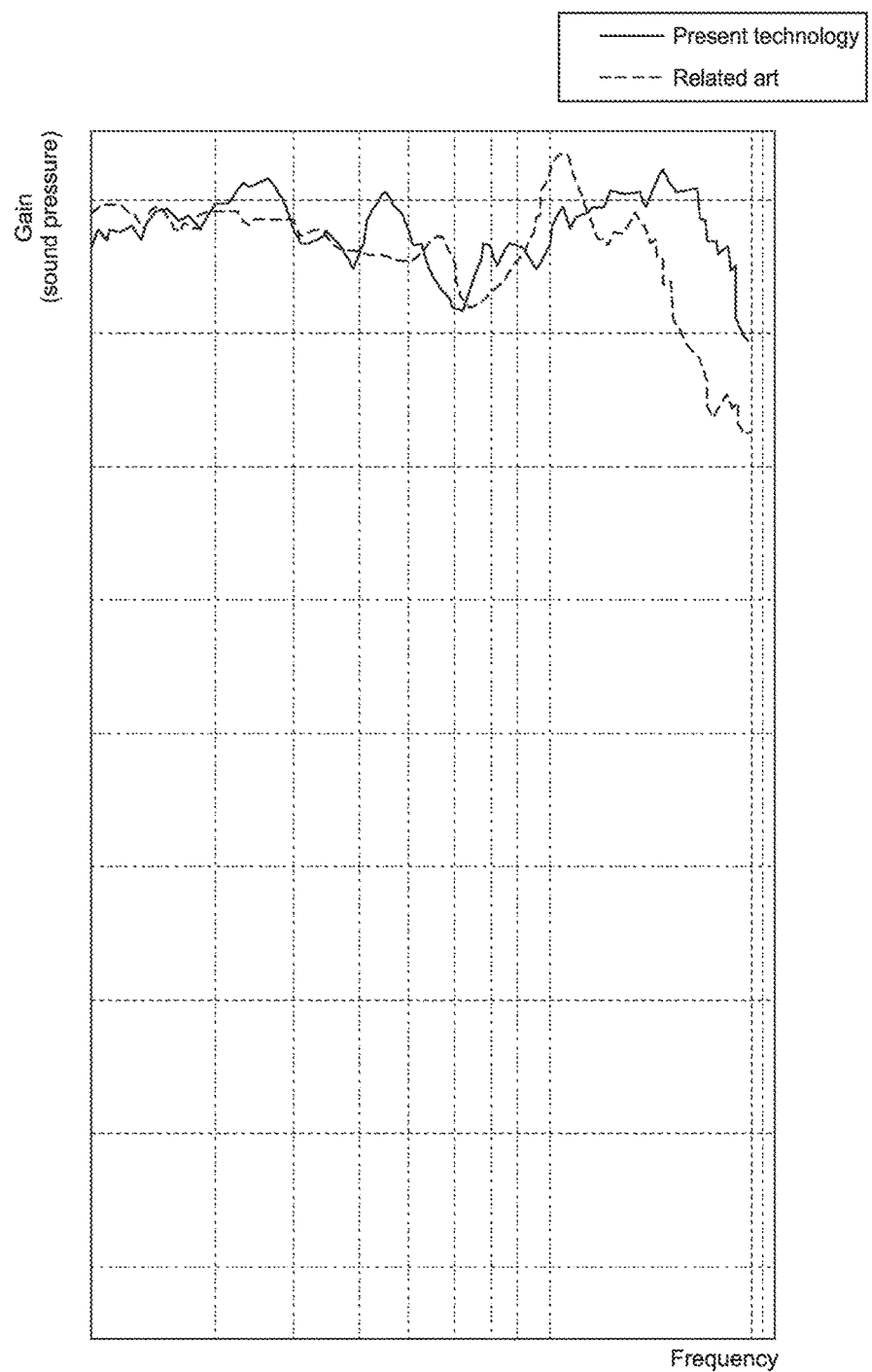
FIG. 8 is a graph showing frequency response characteristics at a high bandwidth of a speaker apparatus including only a coil driving part in the related art and of the speaker apparatus according to the present technology.

FIG. 8 shows the result of frequency response characteristics at a high bandwidth of the speaker apparatus including only the coil driving part in the related art and of the speaker apparatus 1 according to the present technology. It should be noted that the configuration of the speaker apparatus in the related art is similar to that of the speaker apparatus 1 except for the piezoelectric elements 14, 14, and 14, and includes the same members and is formed of materials as those of the speaker apparatus 1.

In FIG. 8, the horizontal axis represents the frequency, and the vertical axis represents the gain (sound pressure). The solid line represents the state of the speaker apparatus 1, and the dotted line represents the state of the speaker apparatus in the related art.

As shown in FIG. 8, in the speaker apparatus 1, the gain is high and a good sound pressure is obtained at a high bandwidth, and a good gain is also obtained at a wide reproduction bandwidth, as compared to the speaker apparatus in the related art.

As described above, the speaker apparatus 1 includes the piezoelectric elements 14, 14, and 14, and the diaphragm 15. One (back end) of each of the piezoelectric elements 14, 14, and 14 is coupled to a front end of the coil bobbin 12 in the movement direction (front-and-back direction), and the piezoelectric elements 14, 14, and 14 are moved to the direction same as the movement direction (front-and-back direction) of the coil bobbin 12. The inner circumference part of the diaphragm 15 is coupled to the other end (front end) of each of the piezoelectric elements 14, 14, and 14. Each coupled part of the diaphragm 15 to each of the piezoelectric elements 14, 14, and 14, and each coupled part of the piezoelectric elements 14, 14, and 14 to the coil bobbin 12 are positioned on a straight line in the movement direction.

Thus, the driving force generated by the magnetic circuit is transmitted to the diaphragm 15 via the two coupled parts positioned on the straight line. As a result, while the driving loss in the diaphragm 15 is reduced, a good sound output is ensured in the wide bandwidth.

Also, the coupled parts of the piezoelectric elements 14, 14, and 14 are positioned outer than the center of the diaphragm 15, and the piezoelectric elements are not coupled to the center part of the diaphragm where the frequency response characteristics are likely to be single-peaked characteristics. Therefore, a good sound output is ensured in the wide bandwidth.

Furthermore, the d33 mode piezoelectric elements 14, 14, and 14 each having a great driving force and a rapid responsibility are used as the driving part. As compared to the case that only the coil bobbin 12 is used as the driving part, it is possible to improve transient response characteristics.

Alternative Embodiment of Piezoelectric Element

Figure 9:
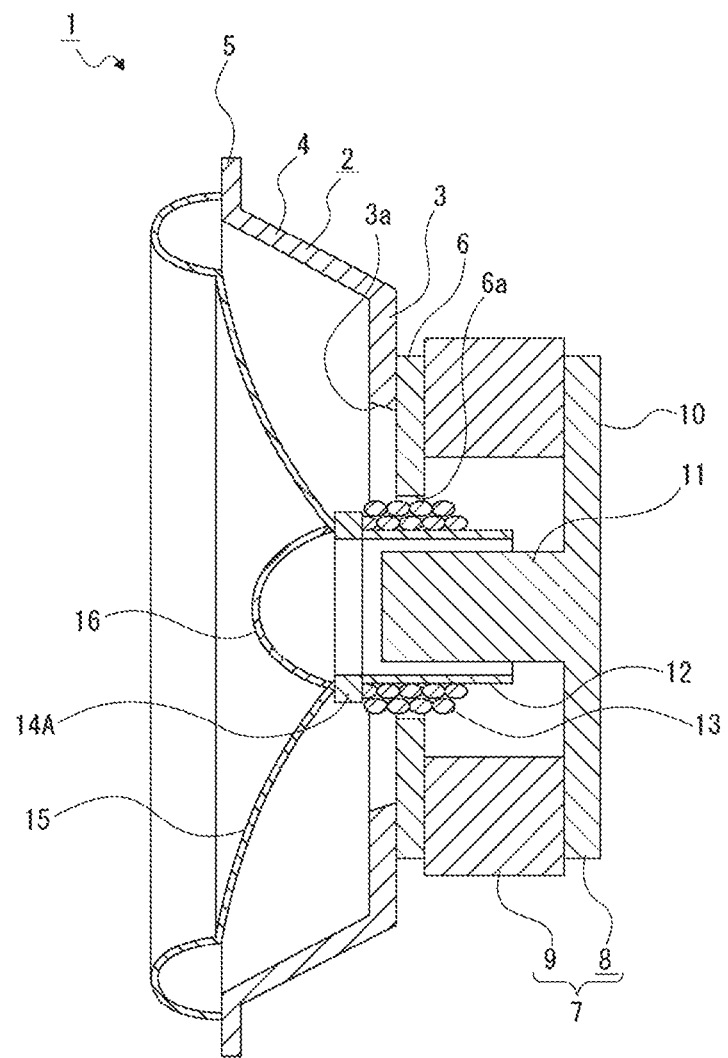
FIG. 9 is an enlarged cross-sectional view of a speaker apparatus using a piezoelectric element according to an alternative embodiment.

The above description illustrates the piezoelectric elements 14, 14, and 14 extending in the front-and-back direction (movement direction) and disposed separately in the circumferential direction. In the speaker apparatus 1, a circular, e.g., ring-shaped piezoelectric element 14A may be used instead of the piezoelectric elements 14, 14, and 14 (see FIG. 9).

For example, the piezoelectric element 14 is a single-layer element. Note that the piezoelectric element 14A may be a laminated type piezoelectric element where layers are laminated in the front-and-back direction similar to the piezoelectric element 14.

One end (back face) of the piezoelectric element 14A is coupled to the whole circumference of the front end of the coil bobbin 12, and the other end (front face) of the piezoelectric element 14A is coupled to the whole circumference of the inner circumference part of the diaphragm 15. As a result, the coupled part of the diaphragm 15 to the piezoelectric element 14A and the coupled part of the piezoelectric element 14A to the coil bobbin 12 are positioned on a straight line in the movement direction.

Similar to the piezoelectric element 14, the piezoelectric element 14A of the d33 mode is used.

As described above, since the circular piezoelectric element 14A is coupled to the coil bobbin 12 in the whole circumferential direction, a good positional balance of the piezoelectric element 14A with respect to the coil bobbin 12 and the diaphragm 15 is ensured. Hence, the driving force (driving energy) is stably transmitted from the coil bobbin 12 to the diaphragm 15 via the piezoelectric element 14A, and the driving force (driving energy) is stably transmitted from the piezoelectric element 14A to the diaphragm 15, thereby reducing the driving loss.

In addition, since the piezoelectric element 14A coupled to the whole circumference of the coil bobbin 12 and to the whole circumference of the diaphragm 15 is used, the diaphragm 15 is vibrated stably and reliably over the whole frequency regions where the sound is output.

<Others>

The above description illustrates that the diaphragm 15, the piezoelectric element 14 or 14A, and the coil bobbin 12 are positioned in the order from the front side. The positional relationship among the diaphragm 15, the piezoelectric element 14 or 14A, and the coil bobbin 12 may be configured such that the diaphragm 15, the coil bobbin 12, and the piezoelectric elements 14 or 14A are positioned in the order from the front side, for example.

Present Technology

The present technology may have the following configurations.

(1) A speaker apparatus, including:
a circular coil bobbin at least partly disposed between a yoke and a magnet;
a coil wound around the coil bobbin, the coil being configured to be moved with the coil bobbin where a driving current is supplied to the coil;
a piezoelectric element having one end coupled to one end of the coil bobbin in a movement direction, the piezoelectric element being configured to be expanded and contracted and moved in a direction same as the movement direction where an electric current is supplied to the piezoelectric element; and
a diaphragm having an inner circumference part coupled to another end of the piezoelectric element,
a coupled part of the diaphragm to the piezoelectric element and a coupled part of the piezoelectric element to the coil bobbin being positioned on a straight line in the movement direction.

(2) The speaker apparatus according to (1) above, in which
the piezoelectric element is coupled to a part of the coil bobbin in a circumferential direction.

(3) The speaker apparatus according to (2) above, in which
a plurality of the piezoelectric elements is disposed, and
the plurality of the piezoelectric elements is disposed separately at equal intervals in the circumferential direction of the coil bobbin.

(4) The speaker apparatus according to any one of (1) to (3) above, in which
the piezoelectric element is formed circular, and
the piezoelectric element is coupled to the coil bobbin in a whole circumferential direction and to the diaphragm in a whole circumferential direction.

(5) The speaker apparatus according to any one of (1) to (4) above, in which
the piezoelectric element is a laminated type piezoelectric element where layers are laminated in the movement direction.

(6) The speaker apparatus according to any one of (1) to (5) above, in which
a time correction is performed so as to roughly match an initial driving time of the diaphragm when the driving current is supplied to the coil and an initial driving time of the diaphragm when the electric current is supplied to the piezoelectric element.

(7) The speaker apparatus according to any one of (1) to (6) above, in which
a phase correction is performed so as to match a phase of the diaphragm when the driving current is supplied to the coil and a phase of the diaphragm when the electric current is supplied to the piezoelectric element.

(8) The speaker apparatus according to any one of (1) to (7) above, in which
the piezoelectric element of a d33 mode is used.

REFERENCE SIGNS LIST 1 speaker apparatus
6 magnet 7 yoke
12 coil bobbin
13 coil
14 piezoelectric element
15 diaphragm
14A piezoelectric element

The invention claimed is:

1. A speaker apparatus, comprising:
a circular coil bobbin at least partly disposed between a yoke and a magnet;
a coil wound around the circular coil bobbin, wherein the coil is configured to move with the circular coil bobbin based on a supply of a driving current to the coil;
a plurality of piezoelectric elements, wherein a first end of each of the plurality of piezoelectric elements is coupled to one end of the circular coil bobbin in a movement direction,
wherein the plurality of piezoelectric elements is disposed separately at equal intervals in a circumferential direction of the circular coil bobbin; and
a diaphragm having an inner circumference part coupled to a second end of each of the plurality of piezoelectric elements, wherein a coupled part of the diaphragm that is coupled to each of the plurality of piezoelectric elements and a coupled part of each of the plurality of piezoelectric elements that is coupled to the circular coil bobbin are positioned on a straight line in the movement direction.

2. The speaker apparatus according to claim 1, wherein the each of the plurality of piezoelectric elements is a laminated type piezoelectric element that comprises a plurality of layers laminated in the movement direction.

3. The speaker apparatus according to claim 1, wherein a time correction is performed so as to match a first initial driving time of the diaphragm and a second initial driving time of the diaphragm, wherein the first initial driving time is based on the supply of the driving current to the coil, and wherein the second initial driving time is based on the supply of the electric current to the plurality of piezoelectric elements.

4. The speaker apparatus according to claim 1, wherein a phase correction is performed so as to match a first phase of the diaphragm and a second phase of the diaphragm, wherein first phase is based on the supply of the driving current to the coil and wherein the second phase is based on the supply of the electric current to the plurality of piezoelectric elements.

5. The speaker apparatus according to claim 1, wherein the plurality of piezoelectric elements is of a d33 mode.

* * * * *